United States Patent [19]

Ball

[11] Patent Number: 4,954,782
[45] Date of Patent: Sep. 4, 1990

[54] SELF-CHECKING OHMMETER THAT CHECKS FOR CONTACT RESISTANCE OF ITS PROBES

[75] Inventor: Edward R. Ball, Bellevue, Wash.

[73] Assignee: The Boeing Company, Seattle, Wash.

[21] Appl. No.: 374,486

[22] Filed: Jun. 29, 1989

Related U.S. Application Data

[62] Division of Ser. No. 48,021, May 8, 1987, Pat. No. 4,876,515.

[51] Int. Cl.$^5$ .............................................. G01R 27/14
[52] U.S. Cl. ...................................... 324/538; 324/705
[58] Field of Search ................... 324/62 R, 115, 538, 324/115, 696, 704, 705, 706

[56] References Cited

U.S. PATENT DOCUMENTS

| | | | |
|---|---|---|---|
| 528,268 | 10/1994 | Armen | 340/647 |
| 1,465,352 | 8/1923 | Dobson | 324/703 |
| 1,569,299 | 1/1926 | Preston | 324/140 R |
| 2,369,070 | 2/1945 | Nielsen | 177/311 |
| 2,575,447 | 11/1951 | Gossick | 175/183 |
| 2,874,351 | 2/1959 | Lamont | 324/57 |
| 3,526,834 | 9/1970 | Brown | 324/57 |
| 3,584,296 | 6/1971 | Wolfendale | 324/57 |
| 3,798,543 | 3/1974 | Takeda et al. | 324/140 |
| 3,978,472 | 8/1976 | Jones | 324/62 |
| 4,047,104 | 9/1977 | Sparber | 324/62 |
| 4,104,578 | 8/1978 | Thuot | 324/28 |
| 4,150,433 | 4/1979 | Kaniel | 364/571 |
| 4,160,949 | 7/1979 | McFayden | 324/62 |
| 4,161,691 | 7/1979 | Vermeers | 324/571 |
| 4,217,651 | 8/1980 | Pickering | 364/120 |
| 4,228,394 | 10/1980 | Crosby | 324/62 |
| 4,323,972 | 4/1982 | Winter | 324/62 |
| 4,342,957 | 8/1982 | Russell | 324/73 |
| 4,605,895 | 8/1986 | Park | 324/133 |
| 4,841,229 | 6/1989 | Eccleston | 324/62 |

OTHER PUBLICATIONS

Asar et al., "Measuring Contact Contamination Automatically", Jul. 1979, *The Western Electric Engineer*, vol. 23, No. 3, pp. 32–38.

Primary Examiner—Reinhard J. Eisenzopf
Assistant Examiner—Maura K. Regan
Attorney, Agent, or Firm—Dellett, Smith-Hill and Bedell

[57] ABSTRACT

A four terminal ohmmeter apparatus includes circuitry for blanking the meter read-out in the event one or more connections to a device or structure under test have been improperly made. The voltage drop between current terminals is determined and compared with a threshold value. The voltage drop between potential terminals or between potential and current terminals, as caused by a separate a.c. source, is also determined and compared with a standard. Individual indicators inform the operator of the validity of each connection in order that corrective action can be taken if necessary. Voltage inputs are also utilized for ascertaining whether a correct meter range is being used and for changing the range if it is improper.

14 Claims, 13 Drawing Sheets

SELF-CHECKING OHMMETER THAT CHECKS FOR CONTACT RESISTANCE OF ITS PROBES

This application is a divisional of Ser. No. 07/048,621 filed 5/8/87, now U.S. Pat. No. 4,876,515.

BACKGROUND OF THE INVENTION

The present invention relates to measuring instruments and particularly to such instruments wherein proper connection with the device or structure under test can be verified.

An advantageous procedure for checking the integrity of metal structures involves low resistance measurements. For example, resistance measurements in the range of 1 milliohm are made on completed aircraft structures to verify proper assembly. This procedure is particularly important for checking the attachment of grounding studs and the like which may actually form a part of the aircraft's electrical system.

The measuring of low resistance values, however advantageous, is often accompanied by inaccuracies of large comparative magnitude and results are often non-repeatable. A measurement made at one stage in production may vary as much as 50% from a measurement made at another stage of production due to differing instruments, differing test leads, and differing contact resistances with the metal structure. A preferred resistance measuring device comprises a modified Kelvin bridge four terminal ohmmeter which essentially compares the unknown resistance with a known standard in the instrument and thereby lessens the effect of test leads and the like on the measuring accuracy. However, differing contact resistance encountered when measurements are undertaken at different times reduces accuracy. Probes and test leads are typically not checked frequently enough and non-conducting substances, wear and oxidation causes eventual increase in contact resistance. Flexing of the test leads results in increases in wire resistance due to individual strand breakage.

Moreover, intermittent contact between probes and the measured structure will sometimes form the basis for an apparently valid resistance reading since some meters tend to average open and closed circuit conditions. Furthermore, some four terminal ohmmeter designs display resistance values even when one or more of four connections from the meter to the tested structure are open circuit or when some of the test leads are connected to one another but not to a structure that is to be measured.

Prior attempts to provide more accurate readings have included frequent test of the ohm-meter instruments with a single or standard set of test leads. However, the same ohmmeter may then be employed with differing test leads and it is not always practical to measure the resistance of individual test leads in the field. Some custom design probes have been developed for making a better connection with specific measuring point geometries. Unfortunately, custom probes for every situation are not practical and contact resistance and lead resistance can still vary over time.

In some cases resistance standards have been included with ohmmeters in the field. The ohmmeter and test leads would be verified for operation by measuring the field resistance standard. This procedure is cumbersome and moreover contact resistances from the probes to an actual tested structure are often higher than the contact resistance to the field resistance standard.

SUMMARY OF THE INVENTION

In accordance with the present invention, a measuring instrument is provided with means for determining the acceptability of connections between the instrument and the actual structure under test. The apparatus incorporates means for determining whether the lead and probe resistances are within predetermined limits before the resistance reading by the instrument is deemed to be accurate. In a preferred embodiment, the numerical read-out of the instrument is disabled in cases where the connecting resistances between the instrument and the structure under test are too high. Furthermore, individual indications are provided relative to the various leads and probes so that the faulty lead will be identified and the operator will be able to make better connection for rendering the measuring output acceptable.

In a four terminal ohmmeter embodiment, including current connections to the structure under test and potential connections to the structure under test, the voltage drop between the current connection means is ascertained as well as voltages between potential connection means and respective current connection means. If these voltages are within predetermined limits, sufficiently low resistance contact has been made with the structure under test and the instrument output is identified as valid.

In another embodiment according to the present invention, substantially all possible combinations of voltages between various potential and current terminals are logically combined to specify the acceptability of the output reading as well as to identify a probe making improper contact, and furthermore to change the range of the instrument as necessary.

In a preferred form of the aforesaid means for determining proper voltages at the potential connection means, a separate a.c. voltage source is utilized, while the source employed in the ohmmeter measuring instrument is d.c. A detector is coupled to the potential connection means and a comparison is made with the output of this detector for determining the presence of the proper voltage.

It is accordingly an object of the present invention to provide an improved self-checking instrument for reducing errors in measurements made in the field.

It is another object of the present invention to provide an improved self-checking instrument which simplifies measurement procedure and reduces the time required therefor.

It is a further object of the present invention to provide an improved self-checking ohmmeter instrument which provides assurance of accuracy under varied conditions.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

FIG. 1 is a schematic diagram of a modified Kelvin bridge four terminal ohmmeter according to the prior art, FIG. 2 is a schematic diagram of the FIG. 1 ohmmeter further including lead and contact resistances, FIG. 3 is a schematic diagram of a first circuit for determining the resistance associated with current terminals of the FIG. 1 ohmmeter, FIG. 4 is a schematic diagram of further circuitry employed according to the embodiment of FIG. 3, FIG. 5 is a schematic and block diagram of a circuit according to the present invention for determining the resistance associated with potential terminals of the aforementioned four terminal ohmmeter, FIG. 6 is a block diagram of circuit means for enabling and disabling an output display according to the acceptability of connections made by the aforesaid four terminal ohmmeter, FIG. 7 is a schematic diagram of an overall circuit according to a preferred embodiment of the present invention, FIG. 8 is a schematic and block diagram of an alternative embodiment for determining resistance associated with current terminals of a four terminal ohmmeter, FIG. 9 is a block diagram of a circuit according to a further embodiment for determining the resistance associated with current terminals of a four terminal ohmmeter, FIG. 10 is a schematic diagram of yet another embodiment of a circuit for determining resistance associated with current terminals of a four terminal ohmmeter, FIG. 11 is a block diagram of further circuitry utilized in connection with the embodiment of FIG. 10, FIG. 12 is a schematic and block diagram of an alternative circuit for determining the resistance associated with potential terminals of a four terminal ohmmeter, FIG. 13 is an illustrative diagram depicting logic means according to an alternative embodiment of the present invention for receiving a number of voltage inputs, associated with a four terminal ohmmeter and providing various indications as to the integrity of the circuit, FIG. 14 is a block diagram illustrating further circuitry as utilized in connection with the embodiment of FIG. 13, FIG. 15 is a state diagram illustrating control of ohmmeter current range, and FIG. 16 is a state diagram depicting enablement of voltage measurements used in the control of ohmmeter current range.

DETAILED DESCRIPTION

Figure 1:
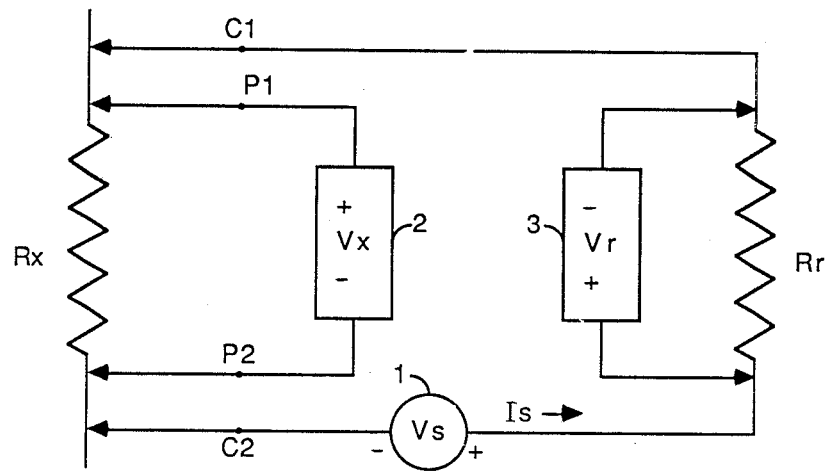

Referring to the drawings, FIG. 1 depicts a modified Kelvin bridge four terminal ohmmeter circuit in a form commonly used for low resistance measurements. The bridge is provided with a d.c. voltage source 1, of voltage Vs, which supplies a d.c. current Is for the measurement process. The voltage source 1 is connected in series with a reference resistance Rr between current terminals C1 and C2 supplied with leads and probes (to the left of the terminals on the drawing) for making connection with means under test, in this case an unknown resistance Rx. A means for measuring the voltage across the reference resistance comprises a first voltmeter 3, said voltmeter taking the form of a high input impedance d.c. voltage measuring device. Means for determining the voltage across potential terminals P1 and P2 of the ohmmeter comprises a voltmeter 2 which is also a high input impedance d.c. voltage measuring device. Leads and probes connected to potential terminals P1 and P2 (to the left of the terminals on the drawing) also make contact across the means under test, i.e., unknown resistance Rx.

Since Is=Vr/Rr, wherein Vr is the voltage across resistance Rr, and since Rx=Vx/Is, where Vx is the voltage across unknown resistance Rx, then $$Rx=(Vx)(Rr)/(Vr)$$

In an actual instrument, a ratiometric voltmeter may be employed, i.e., including a dual slope integrating D/A converter wherein a capacitor is charged with a current proportional to Vx for a predetermined time and then discharged with a constant reference current, with the time for discharge being measured. One typical instrument is Model No. 24-1JH manufactured by Biddle Instruments, Blue Bell, Pennsylvania. The value of Rx may thus be displayed on a voltage ratio measuring volt-meter calibrated by multiplying by the constant Rr.

Figure 2:
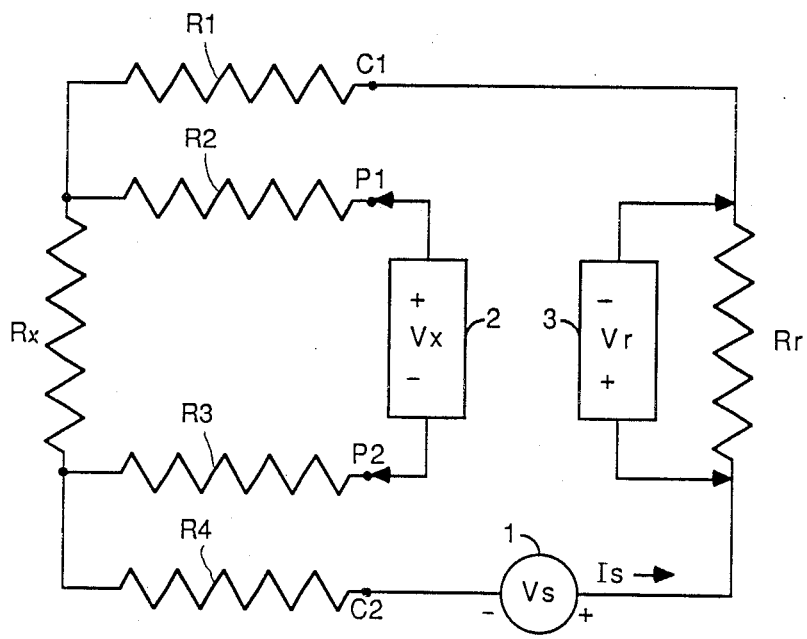

In FIG. 2 the same circuit is depicted but further including the test lead and probe contact resistances. In FIG. 2 resistors R1 and R4 represent the resistance of the current probe leads plus the resistance of the current probe contacts, while resistors R2 and R3 represent the resistance of the potential probe leads plus the resistance of the potential probe contacts. Thus, all components on the right hand side of the four terminals (C1, P1, P2 and C2) represent internal circuitry of a typical four terminal resistance measuring device, while all components to the left of the four terminals represent unknown or uncontrollable parts of the measuring process. For accuracy assurance, maximum values of R1, R2, R3 and R4 which can be tolerated for a specified accuracy over a specified range may be determined empirically. Then, in accordance with the present invention, these resistance values are measured indirectly, and if they exceed the specified limits, an indication is provided notifying the operator of the inaccuracy of the reading for Rx, and/or such reading is disabled. In the disclosed circuitry, the resistance values are ascertained indirectly by comparative voltage drop thereacross.

Figure 3:
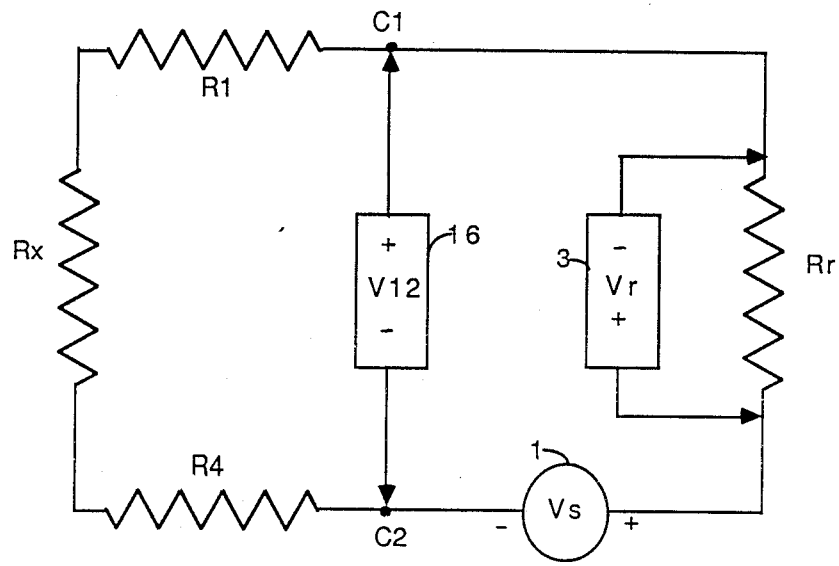

Referring now to FIG. 3, a preferred circuit is illustrated which ascertains the voltage drop between current terminals C1 and C2. It can be assumed that voltage source Vs provides a constant voltage value. Means 16, which senses when the voltage from the C1 terminal to the C2 terminal is below a specified threshold, can be used to enable indicators notifying the user that resistances R1 and R4 are within acceptable range. The voltage from C1 to C2 is designated V12. Since Vs=Vr+V12, and Vr/Rr=V12/(R1+Rx+R4), then (R1+Rx+R4)/Rr=V12/Vr. Substituting the first equation in the last equation provides $$(R1+Rx+R4)/Rr=V12/(Vs-V12)$$

Figure 4:
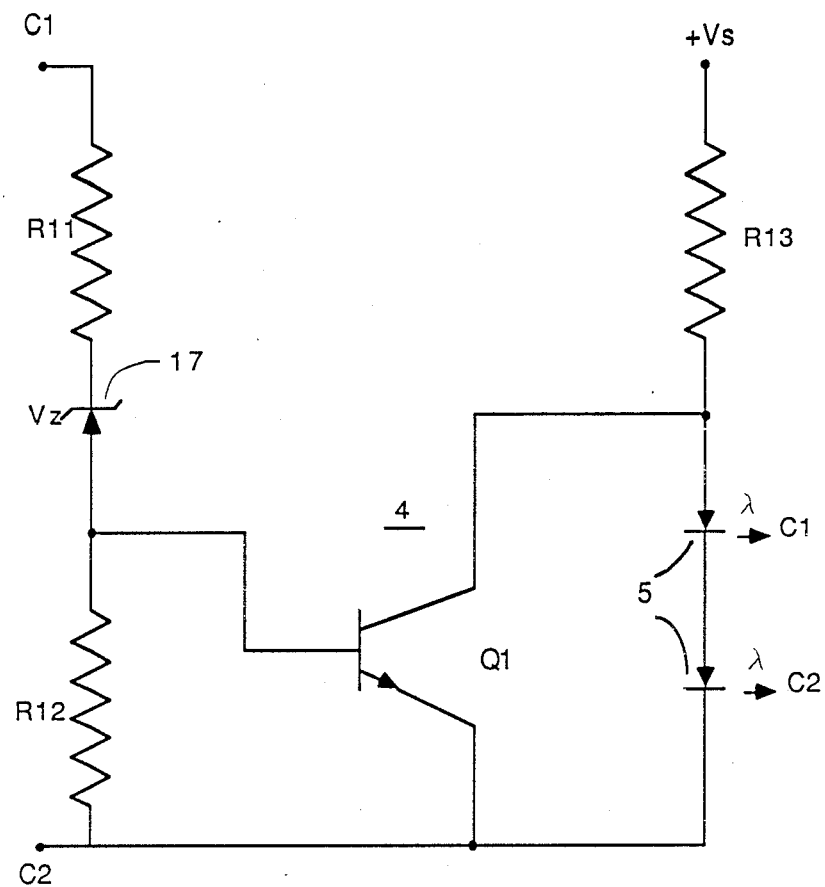

From the last equation it can be seen that by setting a threshold detection value (Vth) for V12, a maximum acceptance limit for (R1+Rx+R4) can be achieved. When V12 is less than such threshold value, then resistances R1 and R4 are within acceptable values. Referring to FIG. 4, a circuit is depicted which further provides this function. Resistance R11, Zener diode 17 and resistor R12 are disposed in series between current terminals C1 and C2. The base of transistor Q1, the latter functioning as a voltage comparator 4, is connected to the junction between resistor R12 and the anode of Zener diode 17. The emitter of transistor Q1 is returned to C2 while its collector is connected through load resistor R13 to voltage source Vs. C1 and C2 indicators, comprising light emitting diodes 5 in series, are coupled between the collector of transistor Q1 and current terminal C2. On the physical apparatus, the light emitting diodes are mounted next to the respective C1 and C2 terminals.

In the FIG. 4 circuit, R11 is employed to limit input current, with Zener diode 17 providing a selectable breakdown voltage chosen to set a threshold value Vth. Resistor R12 normally biases Q1 off. When the voltage V12 is less than Vz (the Zener breakdown voltage) plus 0.6 volts, then very little current flows through R11, and Q1 is held off. At this time R13 supplies current to illuminate the light emitting diodes 5. However, when the voltage V12 becomes greater than (Vz+0.6 volts) then Q1 is turned on and the current from R13 is shunted around the light emitting diodes turning them off. The quantity Vz+0.6 volts is here designated as the threshold value within which V12 must remain for accurate readings of Rx. It is seen this circuit measures the proportion of the voltage Vs across (R1+Rx+R4) as compared with the proportion across Rr.

The circuit of FIG. 4 presents desired high input impedance when the voltage from C1 to C2 is below the threshold value. A response time of less than 10 milliseconds is easily achieved which is contrasted with the typical response time of an ohmmeter's digital display of 0.5 seconds. A rapid response time enables intermittent contact problems to be detected and corrected.

Figure 5:
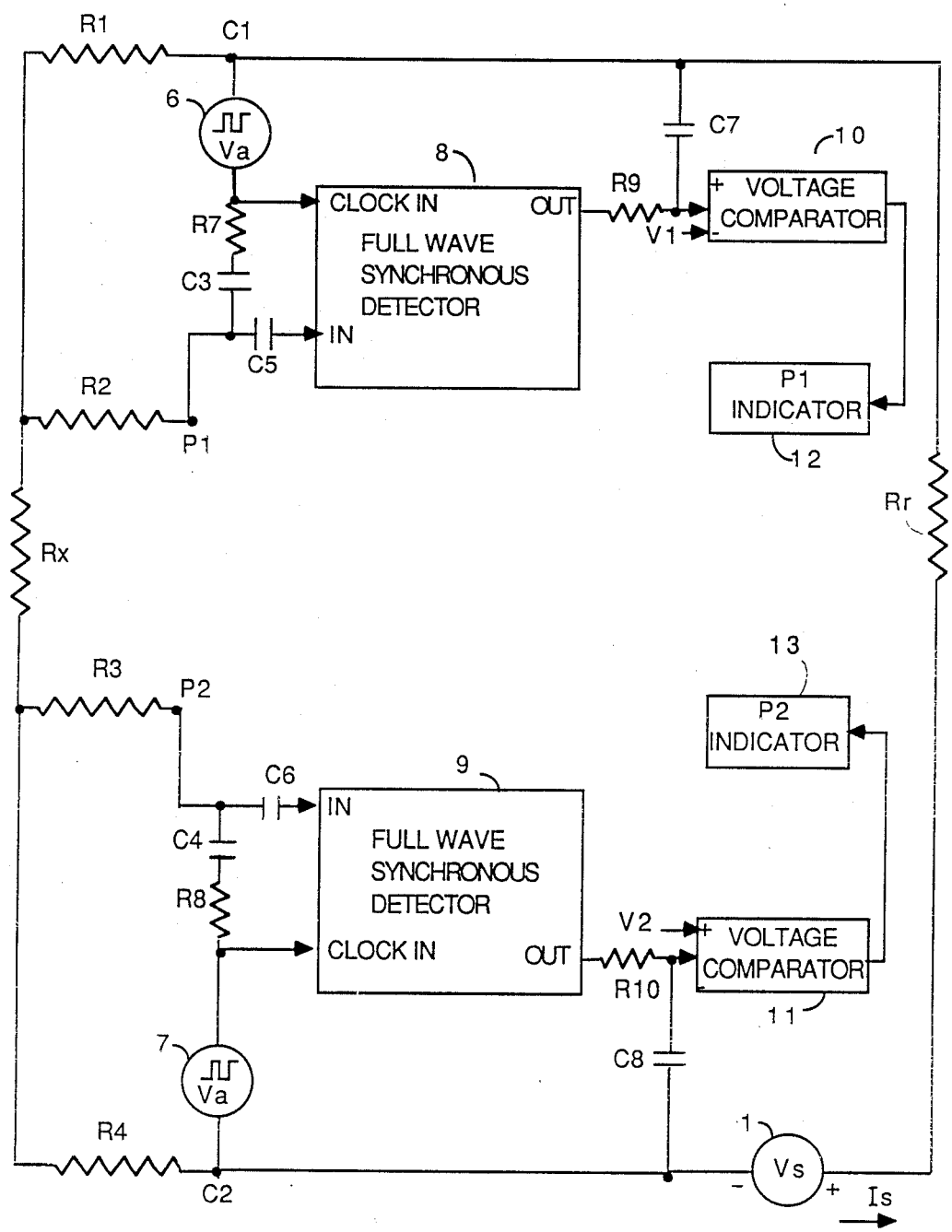

Referring to FIG. 5 preferred circuitry is illustrated for ascertaining lead and probe resistances connected to potential terminals P1 and P2. Again, these resistances are inferred indirectly by detecting voltages at P1 and P2. It will be noted the circuit of FIG. 5 is substantially identical to the FIG. 2 circuit, with the addition of the P1 and P2 detection and indication circuitry.

Voltage sources 6 and 7 (referenced to C1 and C2 respectively), are a.c. voltage sources of constant frequency F and constant peak amplitude Va. Also sources 6 and 7 are in phase with each other to avoid the problem of providing a false output when a closed circuit exists between the two potential terminals as well as between the current terminals, without connection between the potential and current terminals via means under test. The frequency F is chosen to be large enough to enable the use of convenient size blocking capacitors C3 and C4, while the voltage amplitude is chosen to be small enough so that interference with the d.c. voltage measurement of Vx will not occur. If Vs were an a.c. source, then Va could be d.c., or a.c. of a widely differing frequency.

In the FIG. 5 circuit, voltage source 6 returned to current terminal C1 to establish a third point, provides an output through blocking capacitor C3 to potential terminal P1 which is also coupled by means of blocking capacitor C5 to the input of full wave synchronous detector 8. Resistance R7 is the series resistance of source 6 and is chosen to be comparable in value with the maximum acceptable sum of R2+R1. Voltage source 6 further provides the clocking or synchronizing input of synchronous detector 8.

The output of synchronous detector 8 is coupled through a low pass filter consisting of resistor R9, and capacitor C7 returned to C1, to one input of voltage comparator 10. The low pass filter increases the rejection of contact resistance noise and has a rise time of approximately 0.01 second enabling the detection of intermittent contact problems. Voltage comparator 10 receives a d.c. threshold voltage V1 for calibrating the (R2+R1) acceptance limit. It should be noted (R2+R1) is the value of the lead and probe resistances connected to both the P1 and C1 terminals, in series. The output of voltage comparator 10 drives P1 indicator 12 which suitably comprises a light emitting diode which will be illuminated if the voltage detected by the synchronous detector is not excessive in value. Indicator 12 is physically located next to the P1 terminal.

Synchronous detector 8 detects the peak values of both the positive and negative peaks of the a.c. voltage present at the P1 node. During the positive half of a clock cycle, the positive value of the P1 node voltage is present at the output of the detector while during the negative half of the clock cycle, the negative value of the P1 node voltage is multiplied by ($-1$) and is present at the detector output. Therefore the absolute value of the a.c. voltage is presented at the output of the detector in a synchronous manner. The input impedance of the detector 8 is much greater than the Va source impedance. Noise voltages which are at frequencies other than F and its harmonics will be rejected.

In accordance with the detection process it will be seen that in the limit, as a quantity (R1+R2) goes to zero ohms, the peak value of the a.c. component of Va present at node P1 will go to zero volts. Therefore, a relative measurement of the impedance of (R1+R2) can be made by measuring the amplitude of the a.c. voltage present at terminal P1.

If the impedance of capacitor C3 is neglected, then an equation expressing the amplitude of the voltage from Va present at P1 can be written as follows:

$$Va' = Va(R1+R2)/(R1+R2+R7)$$

For calibration purposes, known values of R1 and R2 can be inserted in the circuit and threshold voltage V1 can be adjusted to a value such that P1 indicator 12 will light for the chosen (R1 R2) value and will not light for resistances greater than the chosen value.

The circuit for determining the acceptability of (R3+R4) is substantially identical. Thus, voltage source 7 is coupled to potential terminal P2 through blocking capacitor C4 and terminal P2 is coupled by way of blocking capacitor C6 to the input of full wave synchronous detector 9 which is substantially identical to detector 8. The output of source 7 clocks or synchronizes detector 9. The output of the detector is coupled via filter R10, C8, identical in characteristics to filter R9, C7, to a first input of voltage comparator 11 receiving voltage V2 as a threshold value. The output of comparator 11 is applied to P2 indicator 13 suitably comprising a light emitting diode which becomes illuminated if (R3+R4) is within acceptable limits. Indicator 13 is physically located next to the P2 terminal. The last mentioned portion of the circuit operates in the same manner as previously discussed with respect to the components driven from source 6.

Figure 6:
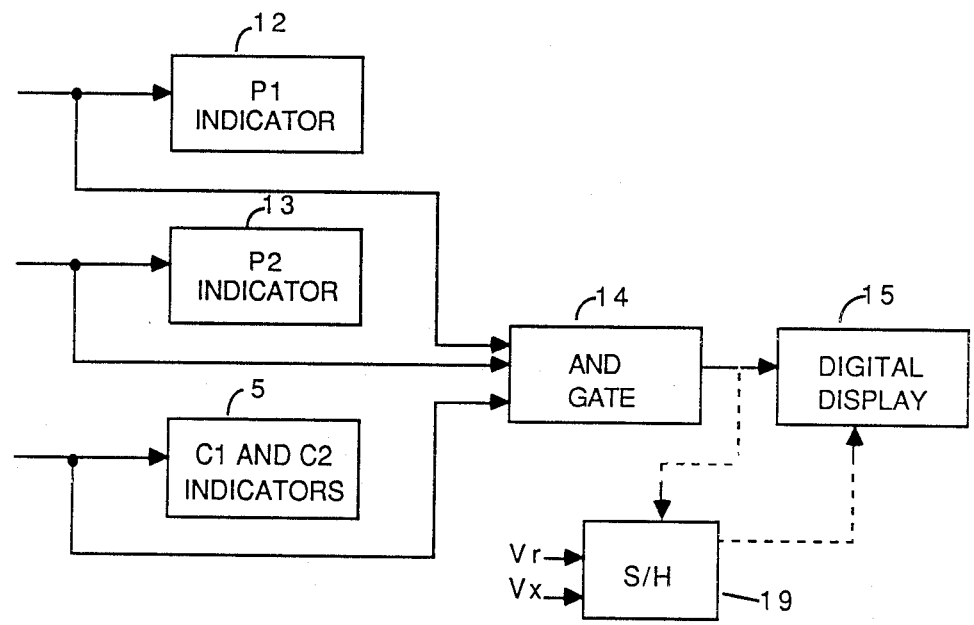

Referring to FIG. 6, a circuit is illustrated for controlling the digital display of the four terminal ohmmeter. Inputs to the respective indicators 12, 13 and 5 are provided to AND gate 14 such that if all indicators are illuminated, AND gate 14 provides an output. This output enables digital display 15 of the four terminal ohmmeter. Thus, the display is blanked whenever any connection from the meter to the structure under test is not satisfactory, and the display is enabled only when all four connections from the meter to the structure are correctly made. A timed dual sample and hold circuit 19 may also be provided. If the gate 14 output is high for a predetermined period, e.g. 100 milliseconds, Vr and Vx values are held and only then used in the ratiometric process for determining and displaying Rx.

Figure 7:
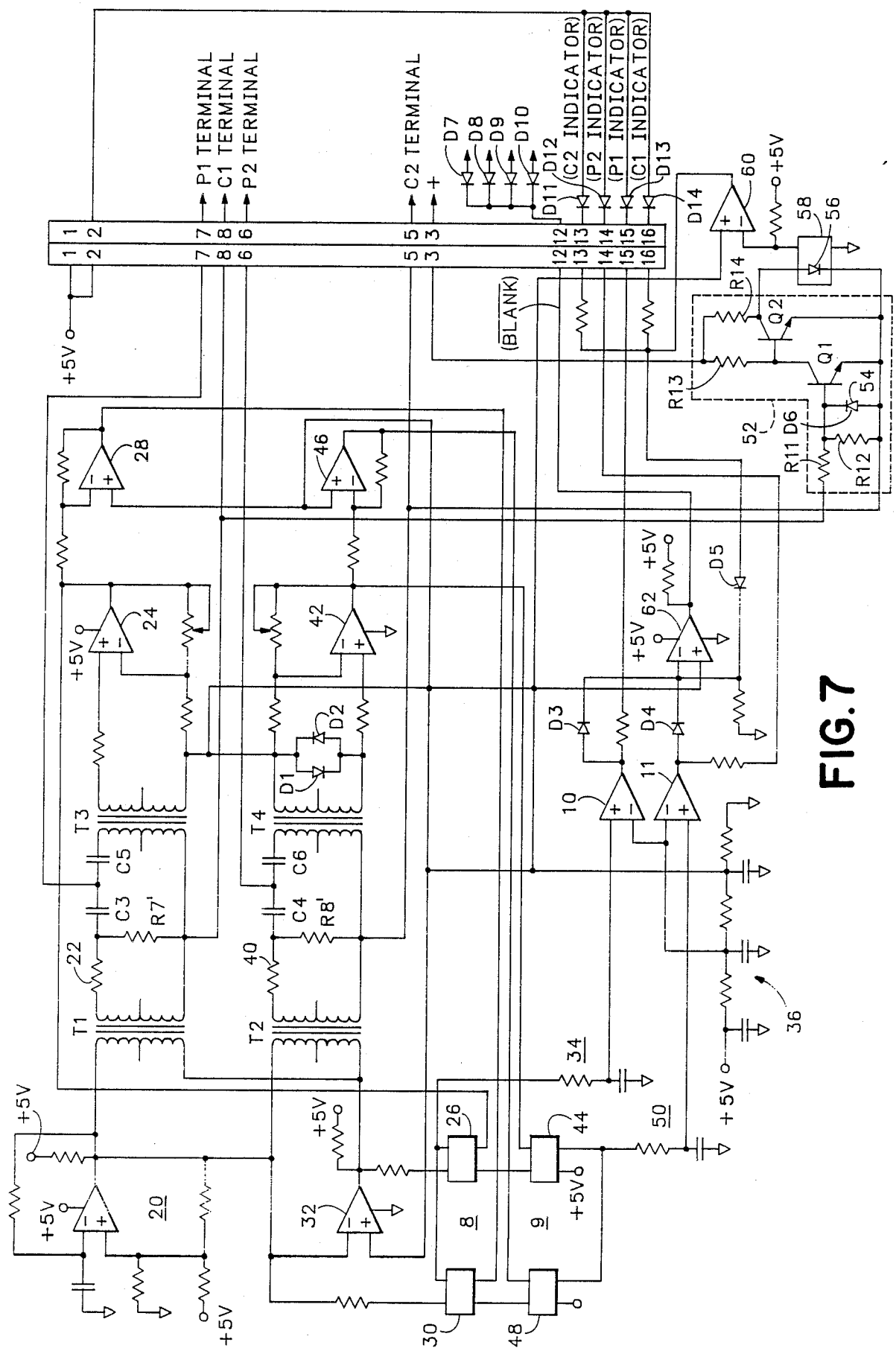

Referring now to FIG. 7, an overall schematic diagram of the self-checking circuit according to the preferred embodiment of the present invention is depicted. A square wave feedback oscillator 20 (performing the function of sources 6 and 7 in FIG. 5) has its output coupled to a first primary terminal of each of isolation transformers T1 and T2, and via inverter 32 to second primary terminals. The secondary of transformer T1 is connected by way of resistor 22 to shunt resistance R7' corresponding to source resistance R7 in FIG. 5. The value of resistor R7' is quite low, e.g. 39 ohms, so that an isolated a.c. voltage source with low internal impedance is formed. One terminal of resistor R7' is coupled by way of capacitor C3 to the P1 potential terminal while the remaining terminal of resistor R7' is connected to the C1 current terminal. Capacitor C5 couples the P1 potential terminal to the primary of isolating transformer T3, said primary being returned to the C1 terminal.

The secondary of isolating transformer T3 drives inputs of amplifier 24 having its output connected to first synchronous switch section 26, functioning as a part of a synchronous detector 8. Also the output of amplifier 24 is inverted by means of amplifier 28 and provided as an input to second synchronous switch section 30 of detector 8. Switch sections 30 and 26 respectively receive the output of oscillator 20 and the inverted output of oscillator 20 by way of amplifier 32 as switching or clocking inputs. Switching is synchronous with the operation of oscillator 20 so as to demodulate the amplitude of the square wave positive and negative half cycles presented by amplifiers 24 and 28. The joint output of switch sections 26 and 30 is supplied through filter 34 to voltage comparator 10. The output of comparator 10, receiving a comparison voltage from voltage divider 36, drives the P1 indicator light emitting diode D13. The circuitry of FIG. 7, as thus far described, carries out the function of determining the acceptability of the resistance combination (R1+R2) in FIG. 5.

Returning to FIG. 7, the secondary of transformer of T2 is connected to low value resistor R8 through series resistance 40 whereby to form a low impedance isolated a.c. source coupled by way of capacitor C4 to the P2 terminal. The remaining side of the secondary of transformer T2 is connected to the C2 terminal as well as to the primary of isolating transformer T4. Blocking capacitor C6 is interposed between the P2 terminal and the remaining connection of the T4 primary.

The secondary of transformer T4 is shunted by protective diodes D1 and D2 and is further coupled to the input of amplifier 42, the output of which is connected to switching section 44 of synchronous detector 9. The output of amplifier 42, inverted by amplifier 46, is provided as an input to switching section 48, forming the remaining portion of synchronous detector 9. The joint outputs of switching sections 44 and 48 are coupled through filter 50 to voltage comparator 11 receiving a comparison value from voltage divider 36 and providing an output to P2 light emitting diode indicator D12. It will be seen the lower portion of the FIG. 7 circuit corresponds to the lower portion of the FIG. 5 circuit for determining the acceptability of (R3+R4).

The portion of the circuit enclosed in dashed lines at 52 in FIG. 7 corresponds to the circuit illustrated in FIG. 4 for ascertaining whether the resistance between the current terminals, i.e., (R1+R4) is acceptably low. In the circuit of FIG. 7, Zener diode 17 of FIG. 4 is not used because of the low voltage supply levels present in the circuit of FIG. 7 and inasmuch as the base emitter junction of transistor Q1 provides the desired threshold action. It will be seen the inputs to the circuit are provided respectively from the C1 terminal and the C2 terminal as in the circuit of FIG. 4.

Transistor Q1 in FIG. 7, having its base emitter junction shunted by protective diode 54, forms a current switch with transistor Q2 which has its base connected to the collector of transistor Q1, its emitter connected to the emitter of transistor Q1, and its collector returned to a voltage source with resistor R14. When transistor Q1 conducts, as when the voltage across the input of the circuit exceeds the designated threshold value, current is diverted from transistor Q2 to transistor Q1 and light emitting diode 56, forming part of optical isolator 58, is no longer shunted but rather light emitting diode 56 becomes illuminated and causes the inverting input terminal of amplifier 60 to be pulled down, removing current from C1 indicator light emitting diode D14 and C2 light emitting diode D11. Thus, as the voltage between the C1 and C2 terminals exceeds the threshold, the C1 and C2 indicators go out for informing the operator of an improper connection. In the absence of the aforementioned input to the inverting terminal of amplifier 60, the C1 indicator and the C2 indicator are illuminated.

The outputs of amplifiers 10, 11 and 60 are coupled by means of diodes D3, D4 and D5 respectively to the common inverting input of amplifier 62. Assuming the output of any one of amplifiers 10, 11 and 60 is up, indicating an improper connection, then the output of amplifier 62 blanks the individual meter display digits through isolation diodes D7 through D10, thus blanking the digital display corresponding to the value of Rx. If the outputs of amplifiers 10, 11 and 60 are all down, then acceptable lead and probe resistances will be indicated and the resistance display is unblanked. It will be seen this portion of the circuit corresponds to the block diagram of FIG. 6.

Figure 8:
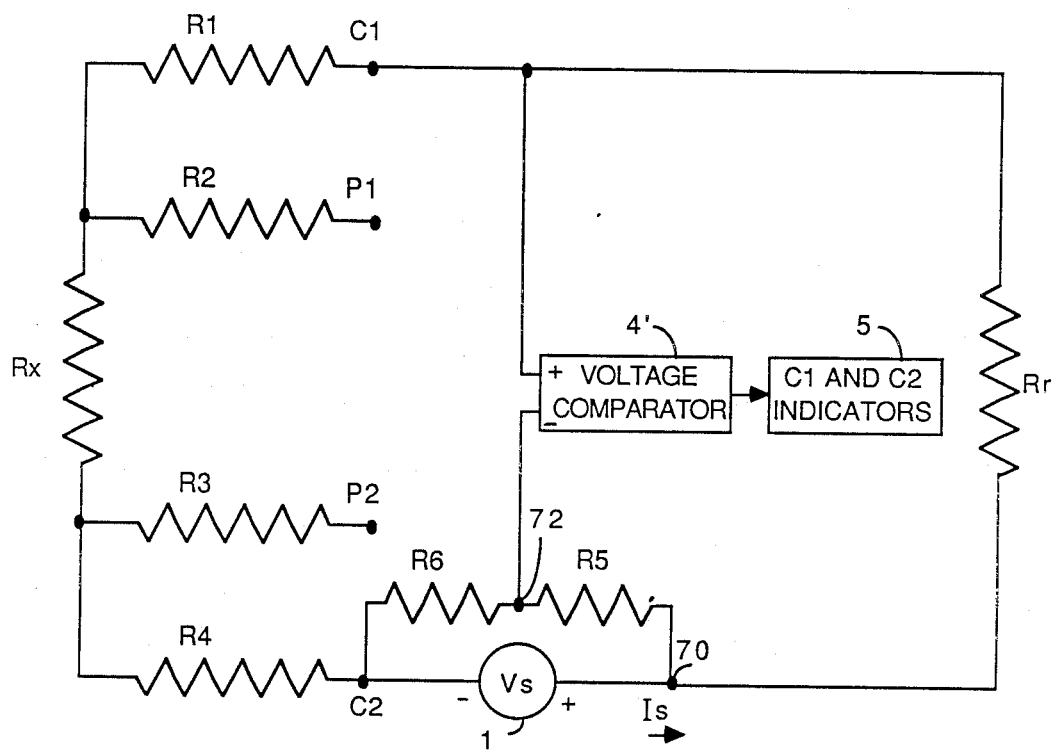

Referring to FIG. 8, a further embodiment is illustrated of means for determining the voltage between terminals C1 and C2 for ascertaining the acceptability of R1+R4. According to this embodiment, a voltage divider R6, R5 is connected across voltage source 1 of the four terminal ohmmeter, i.e., between terminal C2 and a connection 70 at one end of reference resistor Rr. A voltage comparator 4' is provided with inputs coupled respectively to terminal C1 and center tap 72 of the voltage divider. The output of comparator 4' drives the C1 and C2 indicators 5.

Voltage comparator 4' is used to compare the voltage present at terminal C1 to the voltage at the center tap of divider R6, R5. When (R1+Rx+R4)/Rr is less than R6/R5, the output of the voltage comparator will be high causing the C1 and C2 indicators to turn on. For a given value of Rr, the ratio of R6/R5 may be adjusted to provide a desired C1 to C2 resistance comparison threshold. The threshold is the point when (R1+Rx+R4)=(R6.Rr)/R5. It is seen the constant presence of d.c. voltage source Vs enables the detection circuitry to constantly monitor the quality of the connection from terminal C1 through the structure under test to terminal C2.

Figure 9:
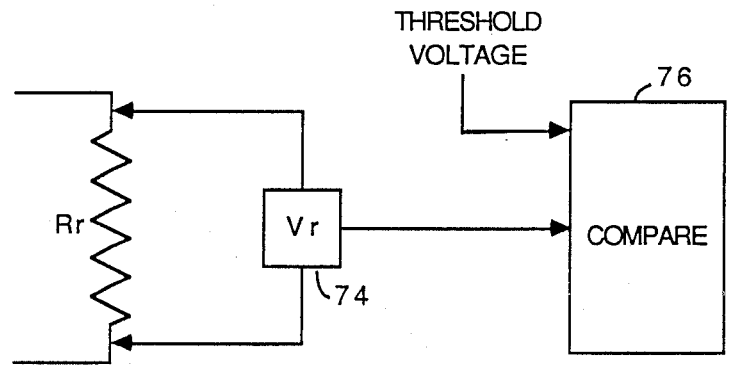

Referring to FIG. 9, a further embodiment is illustrated for assessing the quality of the C1 and C2 connections by determining the voltage between C1 and C2. Assuming Vs (referring to FIG. 3) is constant, and since V12=Vs−Vr, and also since (R1+Rx+R4)/Rr=V12/Vr, then:

$$(R1+Rx+R4)/Rr = (Vs-Vr)/Vr$$

From the last equation it can be seen that a maximum acceptance value for (R1+Rx+R4) can be achieved by providing a threshold acceptance for Vr. Referring to FIG. 9, a separate high input impedance voltage detecting means 74 connected across Rr provides an output to threshold comparator 76. When Vr is greater than the predetermined threshold value, then comparator 76 supplies an output utilized to drive C1 and C2 indicators for turning the same on.

Figure 10:
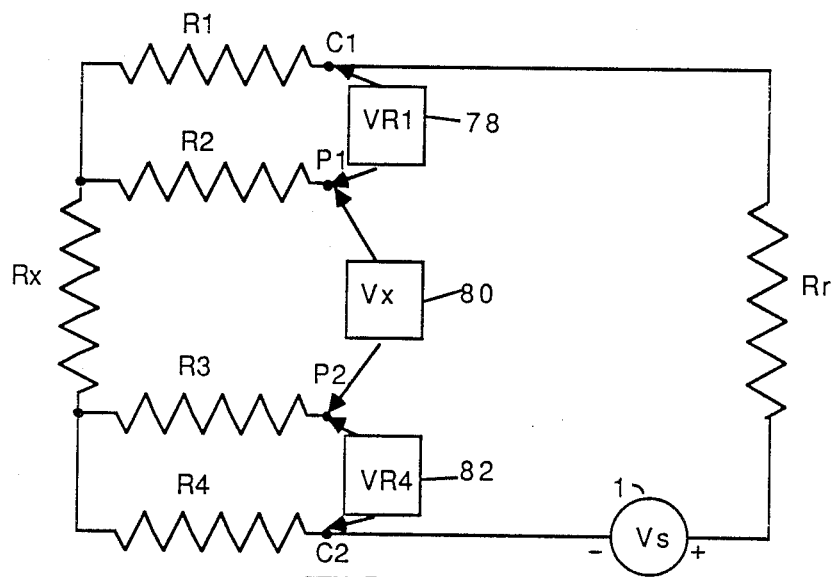

Yet another embodiment of circuitry for determining the voltage between the C1 and C2 terminals is illustrated in FIG. 10. Assume Vs is constant and assume that the P1 and P2 connections are verified as good by a separate circuit, e.g., the circuit illustrated in FIG. 5. The d.c. voltage from C1 to P1 is measured by a high impedance voltmeter 78, and the d.c. voltage from P2 to C2 is measured by high impedance voltmeter 82. The d.c. voltage drop across resistors R1 and R4 are thereby measured since the d.c. current flow through R2 and R3 to the potential terminals is negligible due to the very high d.c. input impedance at potential terminals P1 and P2. Thus, any d.c. voltage measured across C1 and P1, for example, will result almost entirely from d.c. current flow through R1. A voltmeter 80 measures the voltage across Rx.

Referring to the circuits of FIG. 3 and FIG. 10, the following equation can be written:

$$V12 = VR1 + Vx + VR4$$

Figure 11:
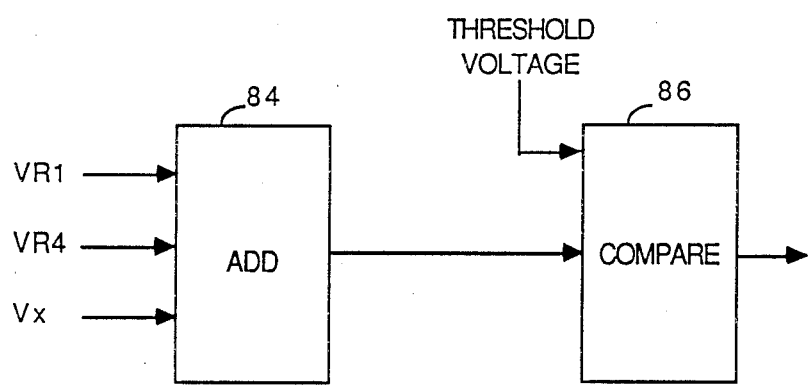

Referring now to FIG. 11, the voltages VR1, Vx and VR4 are summed in adder 84, with the summation being supplied to comparator 86. This comparison is substantially the same as described in connection with the circuit of FIG. 4. The adder 84 is suitably implemented with three isolated operational amplifiers receiving the respective voltages VR1, VR4 and Vx as inputs, the outputs of said amplifiers being coupled in a summing network.

Figure 12:
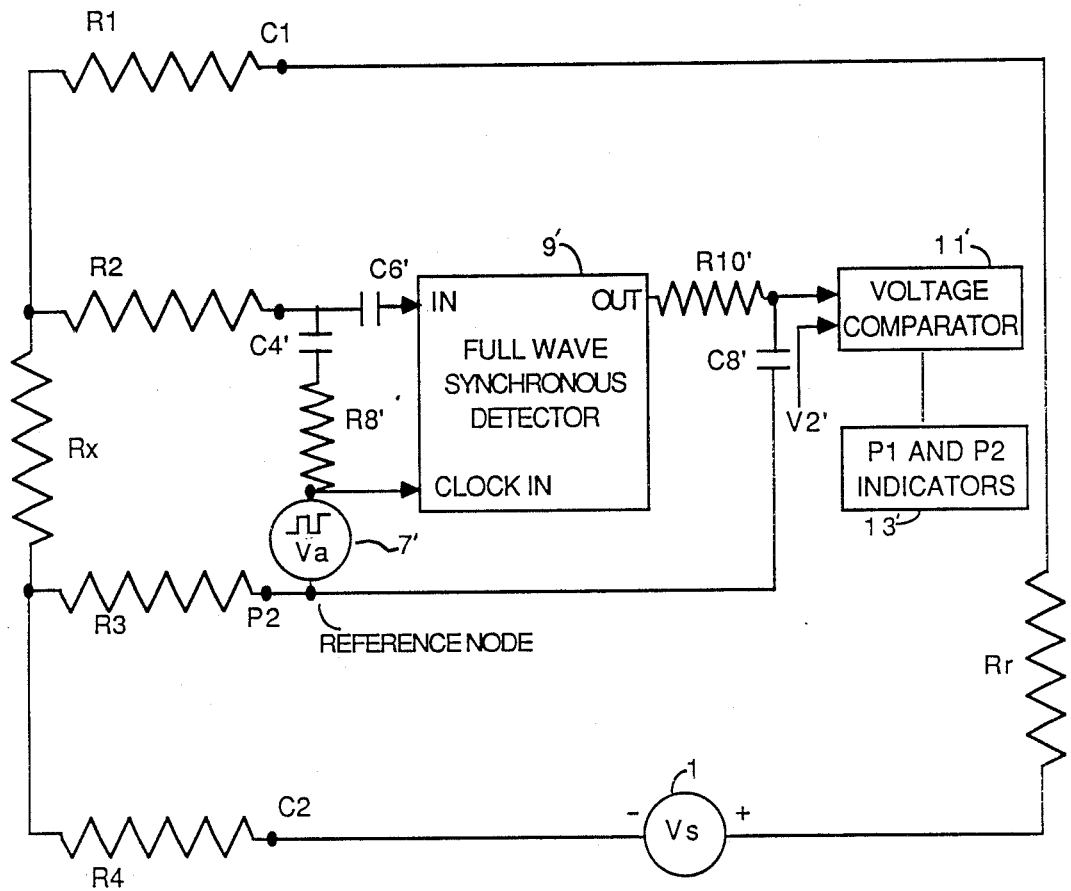

Referring to FIG. 12, an alternative embodiment is illustrated for ascertaining the acceptability of resistance values R2 and R3. As will be noted this circuit is similar to the circuit of FIG. 5, and corresponding components are referenced employing primed numerals. In the circuit of FIG. 12, however, the voltage across terminals P1 and P2 is ascertained rather than determining the voltage at each potential terminal with respect to a current terminal.

A.c. voltage source 7' in FIG. 12 is in series with source resistance R8' and d.c. blocking capacitor C4', the latter being connected to terminal P1. Source 7' is referenced to P2. D.c. blocking capacitor C6' couples the a.c. voltage component between terminals P1 and P2 to synchronous detector 9' which is also clocked from source 7'. When the amplitude of the a.c. component of Va detected by synchronous detector 9' is less than a threshold value, then the total resistance (R2+Rx+R3) is less than a known value, and the connections between P1 and P2 and the structure under test can be considered as satisfactory. It will be appreciated that the remainder of the circuit operates in a substantially similar manner to the circuit depicted in FIG. 5. The FIG. 5 circuit is, however, preferred.

Figure 13:
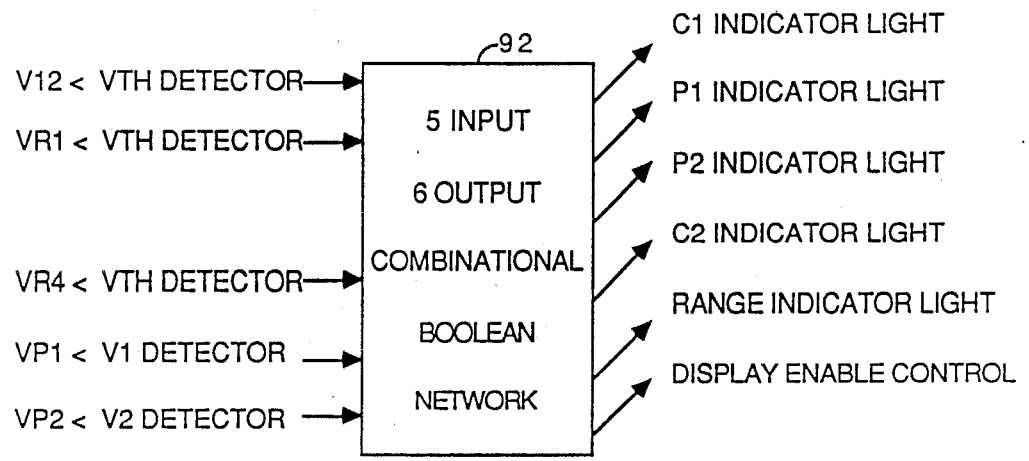
Figure 14:
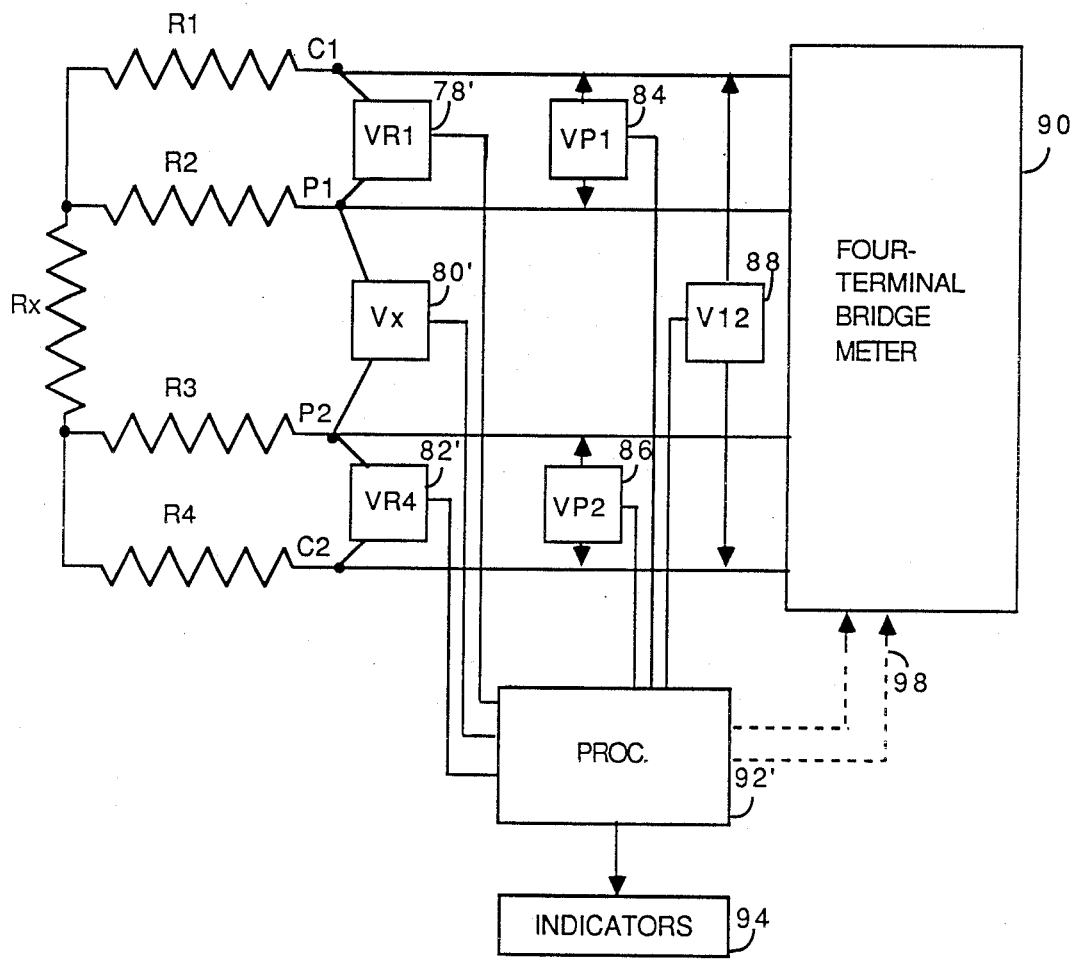

Yet another embodiment is illustrated in FIGS. 13 and 14 depicting circuitry that is logically responsive to a plurality of input voltage states in the four terminal ohmmeter apparatus for supplying the information regarding the acceptability or non-acceptability of the ohmmeter reading. As depicted in FIG. 13, threshold compared voltage inputs V12, VR1, VR4, VP1 and VP2 are supplied to a combinational Boolean network 92, suitably comprising an EPROM programmed to operate according to Table I (hereinafter more fully described). "Voltage" inputs (listed above) are in 1 or 0 form, wherein if a voltage is less than a predetermined threshold a 1 input is supplied, while if the voltage is greater than a predetermined threshold (indicating too high a resistance value) then a 0 input is supplied. Referring to FIG. 14, voltage detection devices 78' and 82' therefore comprise threshold detection circuits providing the aforementioned 1 or 0 logical outputs if the respective voltages measured are below or above the threshold. Similarly, voltage detecting device V12 supplies an output according to whether the indicated voltage is below or above a predetermined threshold. Furthermore, circuits 84 and 86 represent the circuitry in the upper portion and lower portion of FIG. 5, but similarly supply a 1 output if the measured voltage is below threshold and a 0 output if the measured voltage is above threshold. The FIG. 13 embodiment utilizes d.c. sensing points as illustrated in FIGS. 3 and 10, and a.c. voltage P1 and P2 sensing as shown in FIG. 5. Table I lists conceivable states for five detectors (maximum $2^5=32$), but excluding states which are not possible.

In addition to providing indicator outputs for notifying the user of the status of connections to terminals C1, P1, P2 and C2, network 92 further provides a range indicator light output for notifying the operator that the wrong resistance range is being utilized, and a display enable control for blanking the ohmmeter output display in the event of improper connections. A numeral 1 in the indicator columns for C1, P1, P2 and C2 denotes that the indicator light is on, while a 0 indicates that the light is off. A 1 written in the R column indicates the meter range is satisfactory, while a 0 in the R column indicates the selected ohmmeter range is too low. A 0 in the D column indicates that the ohmmeter display is blanked, while a 1 indicates the display is enabled.

By inspection of Table I it can be seen that whenever the a.c. voltage test at a potential terminal is good, then the d.c. voltage test at that potential terminal is considered valid. If the a.c. voltage test is bad or open circuit, then the d.c. voltage test results are not used. However, the d.c. voltage test from the V12 detector (88 in FIG. 14) is always used.

In line number 16 in Table I, all terminals are noted as making proper contact, but the ohmmeter range is too low. Thus, voltage V12 is too high as indicated by a 0 in the V12 column. Under these circumstances, the display is still blanked. As seen in FIG. 14, the logical network 92 which may comprise a processor 92' suitably provides outputs 98 to four terminal bridge meter 90, as well as to indicator lights 94. The outputs to four terminal bridge meter 90 respectively blank numerical read out of the meter when proper connections are not being made, and may also indicate the incorrect range as hereinafter more fully discussed.

TABLE I

| Line No. | Detectors | | | | | Indicators | | | | | |
|---|---|---|---|---|---|---|---|---|---|---|---|
| | V12 | VR1 | VR4 | VP1 | VP2 | C1 | P1 | P2 | C2 | R | D |
| 1  | 0 | 0 | 0 | 0 | 0 | 0 | 0 | 0 | 0 | 1 | 0 |
| 2  | 0 | 0 | 0 | 0 | 1 | 1 | 0 | 1 | 0 | 1 | 0 |
| 3  | 0 | 0 | 0 | 1 | 0 | 0 | 1 | 0 | 1 | 1 | 0 |
| 5  | 0 | 0 | 1 | 0 | 0 | 0 | 0 | 0 | 0 | 1 | 0 |
| 6  | 0 | 0 | 1 | 0 | 1 | 0 | 0 | 1 | 1 | 1 | 0 |
| 7  | 0 | 0 | 1 | 1 | 0 | 0 | 1 | 0 | 1 | 1 | 0 |
| 8  | 0 | 0 | 1 | 1 | 1 | 0 | 1 | 1 | 1 | 1 | 0 |
| 9  | 0 | 1 | 0 | 0 | 0 | 0 | 0 | 0 | 0 | 1 | 0 |
| 10 | 0 | 1 | 0 | 0 | 1 | 1 | 0 | 1 | 0 | 1 | 0 |
| 11 | 0 | 1 | 0 | 1 | 0 | 1 | 1 | 0 | 0 | 1 | 0 |
| 12 | 0 | 1 | 0 | 1 | 1 | 1 | 1 | 1 | 0 | 1 | 0 |
| 13 | 0 | 1 | 1 | 0 | 0 | 0 | 0 | 0 | 0 | 1 | 0 |
| 14 | 0 | 1 | 1 | 0 | 1 | 0 | 0 | 1 | 1 | 1 | 0 |
| 15 | 0 | 1 | 1 | 1 | 0 | 1 | 1 | 0 | 0 | 1 | 0 |
| 16 | 0 | 1 | 1 | 1 | 1 | 1 | 1 | 1 | 1 | 0 | 0 |
| 17 | 1 | 0 | 0 | 0 | 0 | 1 | 0 | 0 | 1 | 1 | 0 |
| 21 | 1 | 0 | 1 | 0 | 0 | 1 | 0 | 0 | 1 | 1 | 0 |
| 22 | 1 | 0 | 1 | 0 | 1 | 1 | 0 | 1 | 1 | 1 | 0 |
| 25 | 1 | 1 | 0 | 0 | 0 | 1 | 0 | 0 | 1 | 1 | 0 |
| 27 | 1 | 1 | 0 | 1 | 0 | 1 | 1 | 0 | 1 | 1 | 0 |
| 29 | 1 | 1 | 1 | 0 | 0 | 1 | 0 | 0 | 1 | 1 | 0 |
| 30 | 1 | 1 | 1 | 0 | 1 | 1 | 0 | 1 | 1 | 1 | 0 |
| 31 | 1 | 1 | 1 | 1 | 0 | 1 | 1 | 0 | 1 | 1 | 0 |
| 32 | 1 | 1 | 1 | 1 | 1 | 1 | 1 | 1 | 1 | 1 | 1 |

In order to provide the most accuracy in resistance measurement, the optimum full scale meter range should be selected for a given measured resistance value. In most cases this is achieved by selecting the lowest range which contains the reading, thereby obtaining maximum resolution on a digital meter. If the resistance value is unknown, the fastest procedure for an operator to use is to start at the highest meter resistance range, touch the probes to the unknown resistance, and then decrease the meter range until the highest resolution reading is obtained.

In some situations it is difficult to tell if the unknown resistance Rx is larger than the selected meter range, or if there is an open circuit on one or more of the four terminals. This problem is solved according to the present embodiment by also providing a range indicator light (FIG. 13). Line 16 in Table I illustrates the condition wherein all of the terminals are indicated as making proper connection (by lights next to the terminals), but the range indication is absent (under column R in Table I). The condition of the range indicator light tells the operator to increase the meter range. However, automatic range selection would relieve the operator of making this change.

Referring again to FIG. 14, the Boolean network 92 of FIG. 13 is advantageously replaced with a programmed microprocessor 92' which provides the same logical outputs for operating indicators 94, and also selects the range of meter 90. The resistance range is selected by selecting the test current which may flow through current terminals C1 and C2, and this in turn is achieved by switching different values of Rr (FIG. 1) for each current range. Rr limits the maximum current which can flow from C1 to C2.

Figure 15:
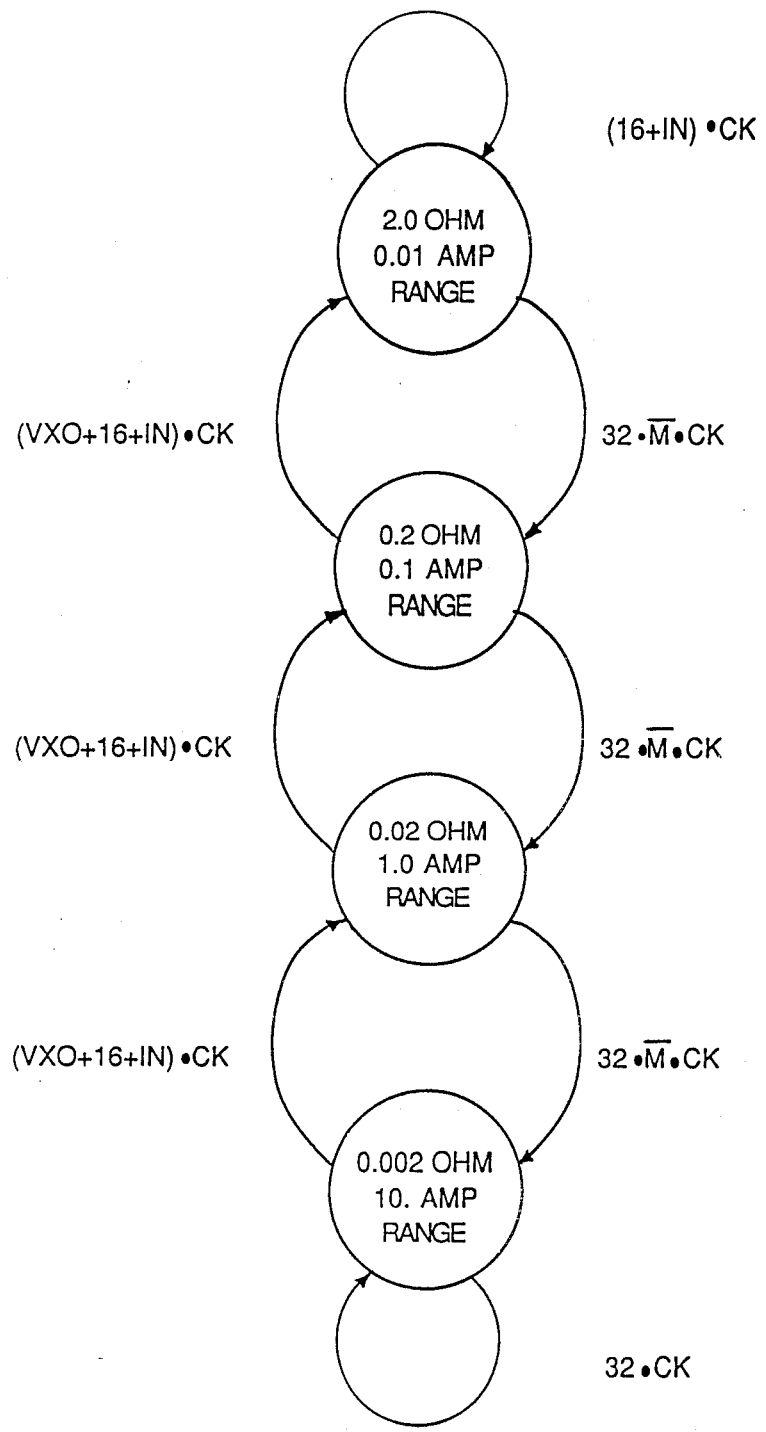

The primary source of information for controlling the automatic range selection is the state of the five detectors 78', 82', 84, 86 and 88, plus a secondary source of information comprising the value of d.c. voltage Vx as provided by detector 80' in FIG. 14. Vx detector 80' (and logic signal VXO) may be located external to the four terminal bridge meter as shown in FIG. 14 or may be part of the necessary Vx measurement voltmeter that is internal to the four terminal bridge meter. State diagrams defining the sequential operation of the processor for automatic range selection are illustrated in FIG. 15, comprising a sequential state and transition diagram depicting control of ohmmeter current range (when the number of current ranges equals 4), and FIG. 16, a sequential state and transition diagram for enabling Vx and Vr measurement for determining the unknown resistance (when the number of ranges equals 4). In these drawings, N=the number of current ranges and M=the number of current ranges plus one. Vx and Vr, used for the ratiometric resistance measurement, are enabled only in state M as identified in the state diagram of FIG. 16. Further in the diagrams, the Boolean algebra expressions written next to each transition are the conditions which cause that transition. "IN" stands for increase resistance range. The numbers 16 and 32 relate to lines in Table I, i.e., the condition of input voltages as set forth at those lines in Table I.

In order for the automatic range selection mode to operate under all conditions, Vx voltmeter 80' should be able to measure voltages at least as large as the threshold value (Vth) chosen for V12, VR1 and VR4. This is the threshold value that these voltages must not exceed in order to provide a logical 1 as a processor input. For meter designs in which the maximum voltage which can be measured by voltmeter 80' is considerably less than the threshold voltage (Vth), additional information is employed for causing test current reduction. This is provided by the generation of a two state logic signal VXO. When voltmeter Vx is enabled and reading its maximum value, the VXO logic signal is high. When the Vx voltmeter is reading less than its maximum value, the VXO logic signal is low. If VXO is high during the rising edge of the system clock for the processor, then a transition to the next lower current range occurs as can be seen in FIG. 15. Boolean algebra expression (VXO+16+IN). CK indicates the transition. VXO does not cause any transitions to occur in the state diagram of FIG. 16.

Figure 16:
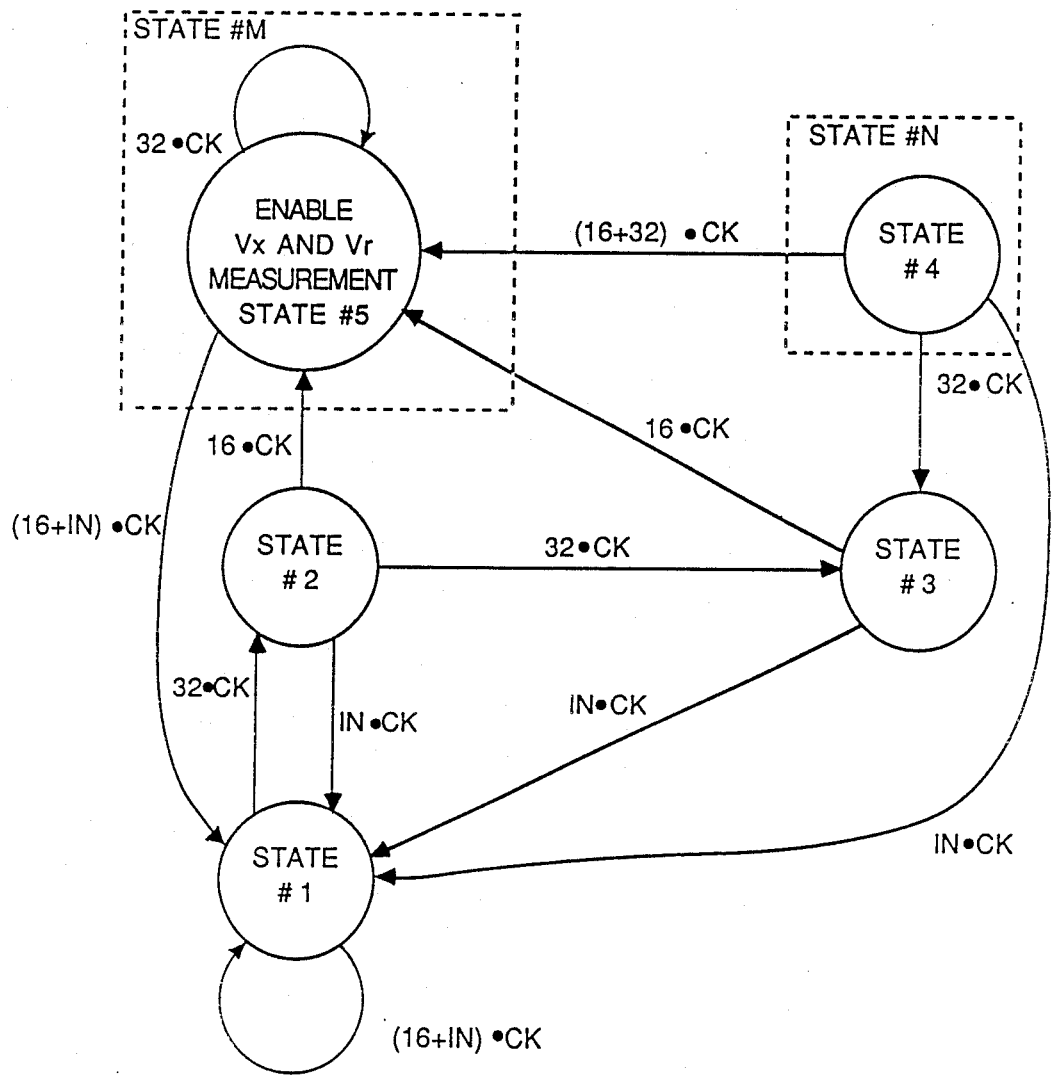

FIGS. 15 and 16 are state diagrams for sequential operations (as implemented with a programmed processor) or two sequential circuits as implemented by digital means utilizing sequential logic in a well understood manner. The sequential operations are synchronized to change states only on the rising edge of the system (processor) clock (CK). The response time of the detectors 78', 82', 84, 86 and 88 is suitably less than 10 milliseconds in each case, and therefore a system clock with a time period of greater than 10 milliseconds can be used.

The sequential operation defined by the FIG. 16 diagram controls when the Vx and Vr measurements may take place for ratiometrically determining the unknown resistance. Vx and Vr measurement may only occur in state M in the upper left hand corner of the diagram. Transitions to a higher current range in the FIG. 15 diagram may only occur when the sequence defined by FIG. 16 is not in state M. This is controlled by the factor $\overline{M}$ in the Boolean algebra expression 32 . $\overline{M}$ . CK.

The number of stable states in FIG. 16 is equal to the number of current ranges from FIG. 15 plus 1, or M as previously noted. This is because "autorange" selection must start at the lowest current range, increase current ranges one step at a time, and then step back one current range if it has gone too far.

The present states in both FIGS. 15 and 16, as well as the states of the detectors in FIG. 14, determine the next states in both FIGS. 15 and 16. In Table I, line 16, all terminals are making proper contact but the current range is too high. Therefore, the Boolean expression "16" is used to reduce current range as indicated in FIG. 15 and to cause the transitions in FIG. 16. In Table I, lines 1-15, the detector V12 output is equal to zero, and at least one terminal is open circuit. In this condition, the ohmmeter should be stepping to the next lower current and next higher resistance range. A Boolean expression for increase resistance range (IN) can be written as follows:

$$IN = \overline{V12} \cdot \overline{16}$$

In Table I, line 32, all terminals are making proper contact and the current range is not too high. However, a higher range might provide better meter resolution. Therefore, the Boolean expression "32" is used to increase the current range in FIG. 15 and to cause transitions in FIG. 16. In the remaining lines of Table I (17-31), it is preferable not to change the meter current range. Therefore, these detected conditions do not produce any transitions in the state diagrams of FIGS. 15 and 16.

A correct connection to any unknown resistor within the total range of the meter causes a step increase in test current (line 32, Table I) every clock cycle until a "line 16" detection, and a single step decrease in test current then occurs. The meter measures Vx and step decreases test current if necessary. Alternatively, a correct connection to any unknown resistor within the lowest resistance range of the meter causes a step increase in test current (line 32) every clock cycle until the highest current range is reached and an additional detector state 32 occurs. Then the meter measures Vx and step decreases the test current if necesssary.

For a meter with N current ranges, a maximum of M clock cycles will be required for the start of the Vx and Vr measurements assuming that all four terminals of the ohmmeter are correctly connected. Meter range selection controllable by Table I detector states can be implemented to operate faster than meter range selection controlled by Vx voltage measurements due to faster response time of the Table I detectors. The number of test current ranges that a particular four terminal ohmmeter has determines the number N, as indicated, and the number of stable states for the FIG. 15 diagram equals N. The number of stable states for the FIG. 16 diagram equals M. In the implementation utilizing a microprocessor or the like, a waiting time is employed before each transition to the next state or current range. The waiting time period is greater than the response time of the Table I detectors. This waiting time corresponds to the time period of the system clock (CK).

While several embodiments of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

What is claimed:

1. A four terminal ohmmeter apparatus including a source of voltage, a reference resistance in series with said source of voltage, means for determining the voltage across said reference resistance, current terminal means terminating the series circuit including said source of voltage and said reference resistance, said current terminal means being provided with manually operable current connecting means, potential terminal means and means for determining the voltage thereacross, said potential terminal means being provided with manually operable potential connecting means, wherein said current and potential connecting means are adapted to provide conductive connection with means under test, said connection being characterized as resistive, said ohmmeter apparatus further comprising:

means coupled to said current terminal means for determining the voltage thereacross when said connecting means are applied to means under test, means coupled to said potential terminal means for determining voltages at said potential terminal means when said connecting means are applied to means under test, and indicating means for providing notification when the voltage across said current terminal means is within predetermined acceptable limits and when voltages at said potential terminal means are within predetermined acceptable limits.

2. The ohmmeter apparatus according to claim 1 wherein said means coupled to said current terminal means for determining the voltage thereacross comprises threshold amplifier means.

3. The ohmmeter apparatus according to claim 1 wherein said means coupled to said current terminal means for determining the voltage thereacross comprises:

a voltage divider disposed across the first mentioned source of voltage, one end of said voltage divider being coupled to a first of said current terminal means, and comparison amplifier means having input connections coupled between a tap on said voltage divider and the remaining current terminal means.

4. The ohmmeter apparatus according to claim 1 wherein said voltage across said current terminal means is determined relative to voltage across said reference resistance.

5. The ohmmeter apparatus according to claim 1 wherein said means coupled to said current terminal means for determining the voltage thereacross comprises means for determining the voltage across said reference resistance, and threshold means responsive to the last mentioned voltage.

6. The ohmmeter apparatus according to claim 1 wherein the voltages at said potential terminal means are determined employing at least one separate source in series with a said potential terminal means.

7. The ohmmeter apparatus according to claim 6 wherein said separate source is an a.c. voltage source while the first mentioned source of voltage is a d.c. voltage source.

8. The ohmmeter apparatus according to claim 7 including logic means responsive to the voltage across said current terminal means and the voltage at said potential terminal means as well as voltages between terminal means for testing the logical combination of said voltages to provide input to said indicating means.

9. The ohmmeter apparatus according to claim 7 wherein said means coupled to said potential terminal means for determining voltages further comprises a detector coupled to a said potential terminal means and comparison means for receiving the output of said detector.

10. The ohmmeter apparatus according to claim 9 wherein said detector comprises a full wave synchronous detector.

11. The ohmmeter apparatus according to claim 9 including means responsive to said logical combination for setting the range of said ohmmeter apparatus by selecting the value of said reference resistance.

12. The ohmmeter apparatus according to claim 1 wherein voltage at a said potential terminal means is determined with respect to a said current connection means.

13. The ohmmeter apparatus according to claim 1 including means responsive to said means coupled to said current terminal means as well as responsive to said means coupled to said potential terminal means for inhibiting read out of said ohmmeter apparatus in the absence of voltages being within predetermined acceptable limits.

14. Apparatus for providing accurate information pertaining to the resistance of means under test, said apparatus comprising:

ohmmeter means for providing a resistance reading, connecting means coupled to said ohmmeter means and manually operable for establishing connection with said means under test, wherein said connection is characterized as resistive, and means coupled to said connecting means for determining the acceptability of the resistance of said connection between said ohmmeter means and said means under test for indicating the relative accuracy of the ohmmeter reading, the relative resistance of said connection being determined separately from said ohmmeter reading, the resistance of said connection being determined by determining the voltage at a said connecting means relative to a third point.

* * * * *

UNITED STATES PATENT AND TRADEMARK OFFICE
CERTIFICATE OF CORRECTION

PATENT NO. : 4,954,782

DATED : September 4, 1990

INVENTOR(S) : Edward R. Ball

It is certified that error appears in the above-identified patent and that said Letters Patent is hereby corrected as shown below:

Column 1, line 52, delete "ohm-meter" and insert --ohmmeter--.

Column 4, line 18, delete "volt-meter" and insert --voltmeter--.

Column 5, line 52, after "voltage source 6" insert a comma (,).

Column 6, line 39, delete "(R1 R2)" and insert --(R1 + R2)--.

Column 12, line 40, delete "(VXO + 16 + IN) . CK" and insert --(VXO + 16 + IN) • CK--.

Column 12, line 62, delete "32 . M . CK ." and insert --32 • M • CK--.

Column 13, line 14, delete "IN = V12 . 16" and insert --IN = V12 • 16--.

Signed and Sealed this

Fourth Day of February, 1992

Attest:

HARRY F. MANBECK, JR.

*Attesting Officer*  *Commissioner of Patents and Trademarks*